(12) United States Patent
Yun et al.

(10) Patent No.: US 10,466,747 B2
(45) Date of Patent: Nov. 5, 2019

(54) FOLDABLE DISPLAY APPARATUS

(71) Applicant: LG DISPLAY CO., LTD., Seoul (KR)

(72) Inventors: YoungJoon Yun, Paju-si (KR); Seungo Jeon, Paju-si (KR); ShinSuk Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/035,190

(22) Filed: Jul. 13, 2018

(65) Prior Publication Data

US 2019/0033920 A1 Jan. 31, 2019

(30) Foreign Application Priority Data

Jul. 28, 2017 (KR) .................. 10-2017-0096398

(51) Int. Cl.
*G06F 1/16* (2006.01)
*G09F 9/30* (2006.01)
*H05K 5/02* (2006.01)

(52) U.S. Cl.
CPC ............ *G06F 1/1652* (2013.01); *G09F 9/301* (2013.01); *H05K 5/0226* (2013.01)

(58) Field of Classification Search
CPC combination set(s) only.
See application file for complete search history.

(56) References Cited

U.S. PATENT DOCUMENTS

| 9,173,287 B1* | 10/2015 | Kim | H05K 1/028 |
| 9,625,947 B2* | 4/2017 | Lee | H04M 1/022 |
| 10,082,838 B1* | 9/2018 | Hong | G06F 1/1681 |
| 2014/0196254 A1* | 7/2014 | Song | E05D 3/14 |
| | | | 16/302 |
| 2016/0014919 A1* | 1/2016 | Huitema | G06F 1/1652 |
| | | | 313/511 |
| 2016/0116944 A1* | 4/2016 | Lee | H04M 1/022 |
| | | | 361/679.26 |
| 2016/0132075 A1* | 5/2016 | Tazbaz | G06F 1/1681 |
| | | | 361/679.27 |

(Continued)

FOREIGN PATENT DOCUMENTS

| KR | 10-2015-0037383 A | 4/2015 |
| KR | 10-2016-0049235 A | 5/2016 |

(Continued)

*Primary Examiner* — Anthony Q Edwards
(74) *Attorney, Agent, or Firm* — Birch, Stewart, Kolasch & Birch, LLP

(57) ABSTRACT

A foldable display apparatus for minimizing a stress applied to a bending region of a flexible display panel is discussed. The foldable display apparatus includes a flexible display panel configured to display an image and including a first display area, a bending area, and a second display area, a first frame supporting a first rear surface of the flexible display panel overlapping the first display area, a second frame supporting a second rear surface of the flexible display panel overlapping the second display area, a first housing accommodating the first frame, a second housing accommodating the second frame, and a hinge module connected between the first housing and the second housing to support the bending area and to guide a bending of the bending area. The hinge module includes a hinge folding path disposed between a front surface and a rear surface of the flexible display panel.

22 Claims, 11 Drawing Sheets

(56) References Cited

U.S. PATENT DOCUMENTS

| | | | |
|---|---|---|---|
| 2017/0235343 A1* | 8/2017 | Cho | G06F 1/1616 |
| | | | 361/679.27 |
| 2018/0049329 A1* | 2/2018 | Seo | E05D 3/06 |
| 2018/0110139 A1* | 4/2018 | Seo | H04M 1/0216 |
| 2019/0032380 A1* | 1/2019 | Wu | G06F 1/1616 |
| 2019/0086965 A1* | 3/2019 | Kuramochi | G06F 1/1652 |

FOREIGN PATENT DOCUMENTS

| KR | 10-2016-0103072 A | 8/2016 |
|---|---|---|
| KR | 10-2017-0022685 A | 3/2017 |

* cited by examiner

FOLDABLE DISPLAY APPARATUS

CROSS-REFERENCE TO RELATED APPLICATIONS

This application claims the priority benefit of the Korean Patent Application No. 10-2017-0096398 filed on Jul. 28, 2017, which is hereby incorporated by reference as if fully set forth herein.

BACKGROUND

Field of the Invention

The present disclosure relates to a foldable display apparatus.

Discussion of the Related Art

Generally, display apparatuses using a flat display panel, such as liquid crystal display (LCD) apparatuses, light emitting display apparatuses, electrophoresis display (EPD) apparatuses, electro-wetting display apparatuses, and quantum dot display apparatuses, are being mainly applied to notebook computers, portable electronic apparatuses, televisions (TVs), monitors, etc.

Recently, in portable electronic apparatuses, as requirements for a large screen increase, display apparatuses including a large-screen display unit connected to a flat display panel have been developed and commercialized. Particularly, foldable display apparatuses using advantages of a flexible display panel capable of being bent or folded maintain portable convenience and provide a large-screen display unit, and thus, are attracting much attention as the next-generation technology of display field.

A related art foldable display apparatus includes a pair of housings, which support a rear surface of a flexible display panel, and a hinge module which is connected between the pair of housings and supports a bending region of the flexible display panel. In the related art foldable display apparatus, the flexible display panel may be folded or unfolded by rotating (or folding) the hinge module.

However, in the related art foldable display apparatus, a tension stress and a compression stress are applied to the bending region of the flexible display panel when the flexible display panel is repeatedly folded and unfolded with respect to the hinge module, and for this reason, a crack occurs in the bending region of the flexible display panel due to the bending stress caused by the tension stress and the compression stress, causing the reduction in reliability of the flexible display panel. Also, in the related art foldable display apparatus, the flexible display panel cannot be unfolded at various angles other than a folded state or an unfolded state.

SUMMARY

Accordingly, the present disclosure is directed to provide a foldable display apparatus that substantially obviates one or more problems due to limitations and disadvantages of the related art.

An aspect of the present disclosure is directed to provide a foldable display apparatus for minimizing a stress applied to a bending region of a flexible display panel.

Another aspect of the present disclosure is directed to provide a foldable display apparatus in which an unfolded angle of a flexible display panel is set to various angles.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a foldable display apparatus including a flexible display panel configured to display an image and including a first display area, a bending area, and a second display area, a first frame supporting a first rear surface of the flexible display panel overlapping the first display area, a second frame supporting a second rear surface of the flexible display panel overlapping the second display area, a first housing accommodating the first frame, a second housing accommodating the second frame, and a hinge module connected between the first housing and the second housing to support the bending area and to guide a bending of the bending area, wherein the hinge module includes a hinge folding path disposed between a front surface and a rear surface of the flexible display panel.

In the foldable display apparatus according to an embodiment of the present disclosure, the flexible display panel can include a panel folding path disposed between the front surface and the rear surface thereof, and the hinge folding path and the panel folding path can be disposed in parallel on the same plane.

The foldable display apparatus according to an embodiment of the present disclosure can further include an unfolded angle control module controlling an unfolded angle of the flexible display panel when the flexible display panel is unfolded, wherein one side of the unfolded angle control module can be connected to one of the first frame and the first housing, and another side of the unfolded angle control module can pass through the hinge module and can be connected to one of the second frame and the second housing.

In the foldable display apparatus according to an embodiment of the present disclosure, the unfolded angle control module can include a first free stop module and a second free stop module disposed in parallel, and each of the first free stop module and the second free stop module can include a guide block installed in one of the first frame and the first housing, a fixing block installed in one of the second frame and the second housing, a sliding block movably supported by the guide block, and a chain connected between the fixing block and the sliding block to pass through the hinge module.

In another aspect of the present disclosure, there is provided a foldable display apparatus including a flexible display panel configured to display an image and including a first display area, a bending area, and a second display area, a first frame supporting a first rear surface of the flexible display panel overlapping the first display area, a second frame supporting a second rear surface of the flexible display panel overlapping the second display area, a first housing accommodating the first frame, a second housing accommodating the second frame, and a hinge module including a panel supporting surface supporting a third rear surface of the flexible display panel overlapping the bending area, the hinge module being bent along a hinge folding path spaced apart from the panel supporting surface to bend the bending area, wherein the flexible display panel includes a panel folding path disposed between a front surface and a rear surface of the flexible display panel, and a distance between the panel supporting surface and the hinge folding path is equal to a distance between the panel supporting surface and the panel folding path.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
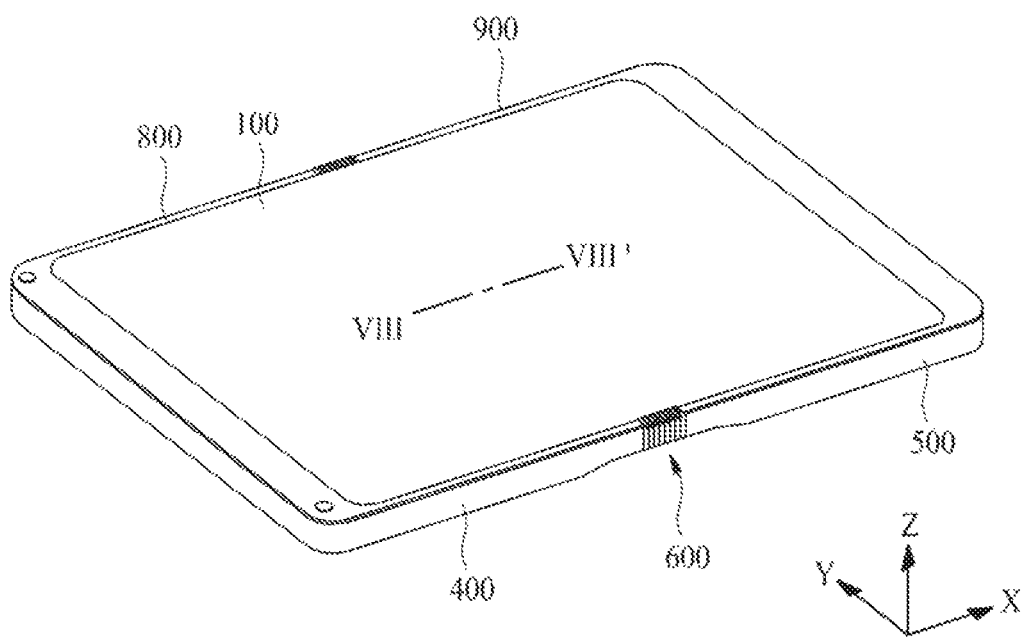
FIG. 1 is a diagram illustrating a foldable display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part can be added unless 'only~' is used. The terms of a singular form can include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts can be disposed between the two parts unless 'just' or 'direct' is used.

In describing a time relationship, for example, when the temporal order is described as 'after~', 'subsequent~', 'next~', and 'before~', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of a foldable display apparatus according to the present disclosure will be described in detail with reference to the accompanying drawings. In adding reference numerals to elements of each of the drawings, although the same elements are illustrated in other drawings, like reference numerals can refer to like elements.

Figure 2:
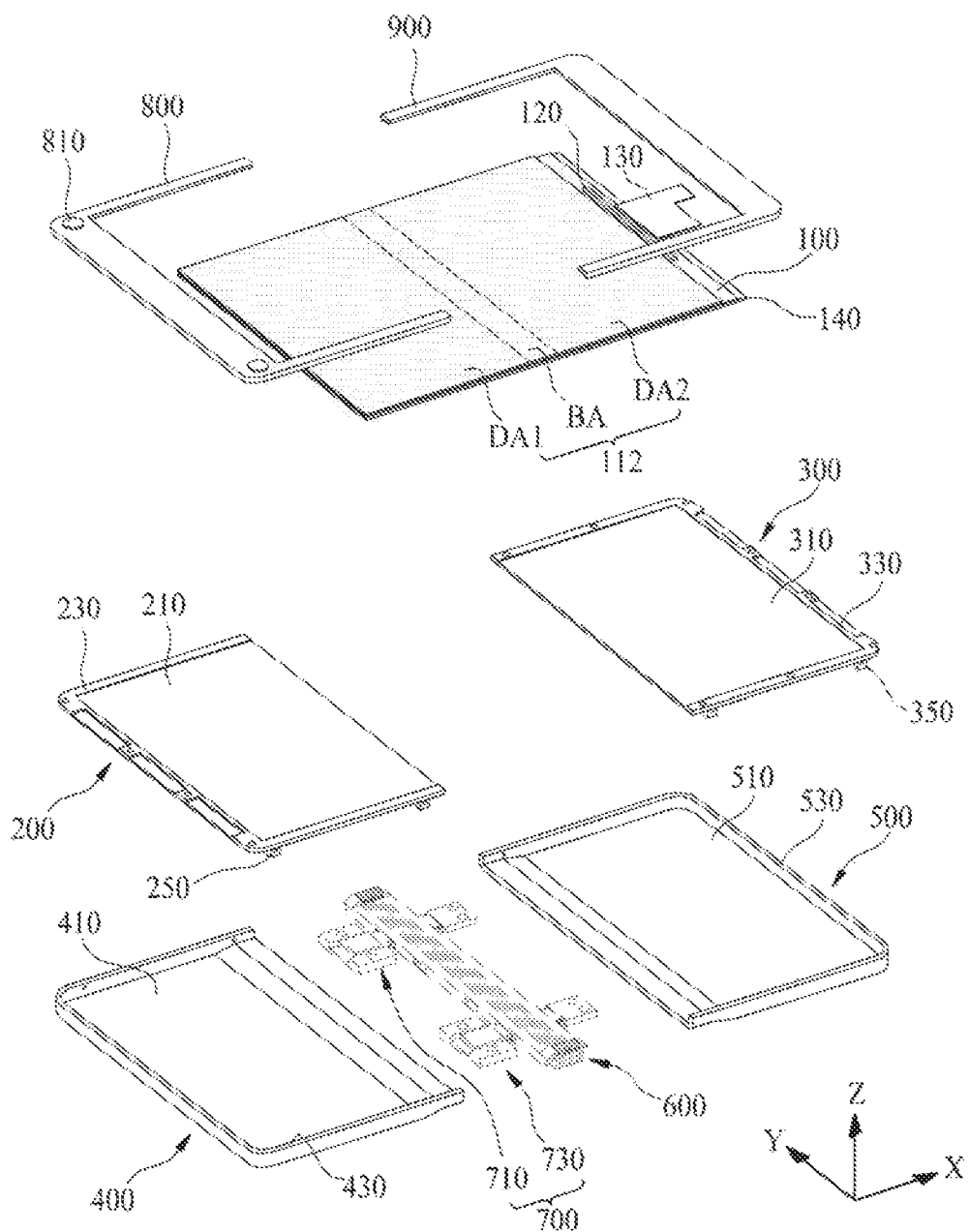
FIG. 2 is an exploded perspective view of a foldable display apparatus according to an embodiment of the present disclosure.

FIG. 1 is a diagram illustrating a foldable display apparatus according to an embodiment of the present disclosure, and FIG. 2 is an exploded perspective view of the foldable display apparatus according to an embodiment of the present disclosure. All the components of the foldable display apparatus according to all embodiments of the present disclosure are operatively coupled and configured.

Referring to FIGS. 1 and 2, the foldable display apparatus according to an embodiment of the present disclosure can include a flexible display panel 100, a first frame 200, a second frame 300, a first housing 400, a second housing 500, and a hinge module 600.

The flexible display panel 100 can be a flexible organic light emitting display panel, a flexible electrophoresis display panel, a flexible electro-wetting display panel, a flexible quantum dot display panel, or the like. Hereinafter, the flexible display panel 100 can be referred to as a panel 100.

The panel 100 can include a display unit 112 where a pixel array including a plurality of pixels is provided to display an image. The display unit 112 can be divided into a first display area DA1, a second display area DA2, and a bending area BA.

The first display area DA1 can be defined as a first area of the panel 100 disposed on one side of the bending area BA of the display unit 112, and the second display area DA2 can be defined as a second area of the panel 100 disposed on the other side of the bending area BA of the display unit 112. However, the present embodiment is not limited thereto, and vice versa. Optionally, the first display area DA1 and the second display area DA2 can have the same size, but without being limited thereto, one thereof can have a relatively larger size. In this case, in a folded state of the panel 100, a portion of a display area having a relatively larger size can be externally exposed, and even when the foldable display apparatus is turned off, the externally exposed portion of the display area can continuously display date, time, a remaining capacity of a battery, notification, and/or the like.

The bending area BA can be defined as an area between the first display area DA1 and the second display area DA2. The bending area BA can be unfolded in a planar state or can be bent in a curve shape having a certain curvature radius, based on folding. Here, the folding can be defined as a folding operation or an unfolding operation of the bending area BA.

The panel 100 can be unfolded in a planar state according to unfolding of the bending area BA, and thus, the first display area DA1, the second display area DA2, and the bending area BA can configure one display unit 112, thereby providing a relatively wide screen. On the other hand, when the bending area BA is folded, the panel 100 can be disposed in order for the first display area DA1 to directly face the second display area DA2, and thus, can have a relatively short length.

Additionally, the foldable display apparatus according to an embodiment of the present disclosure can further include a driving integrated circuit (IC) 120 and a flexible circuit film 130.

The driving IC 120 can be mounted on a chip mounting area provided in one non-display area of the panel 100 through a chip bonding process and can drive the pixels provided in the display unit 112 to allow the display unit 112 to display an image, based on a pixel driving signal and a data signal supplied through a display pad part. Optionally, the driving IC 120 can be mounted on the flexible circuit film 130 and can be connected to the pixel array.

The flexible circuit film 130 can be attached on the display pad part provided in the panel 100 through a film attaching process and can transfer a signal and various powers, supplied from a system driver, to the driving IC 120. The flexible circuit film 130 can be configured with a tape carrier package (TCP), a chip on film (COF) (or a chip on flexible board), or a flexible printed circuit. One end of the flexible circuit film 130 can be attached on the display pad part, and the other end of the flexible circuit film 130 can be connected to the system driver disposed in a circuit accommodating space of the second housing 500.

A rear surface of the panel 100 can be supported by a flexible rear film 140.

The flexible rear film 140 can be attached on a whole rear surface of the panel 100 and can maintain the flexible panel 100 in a flat state. The flexible rear film 140 can be formed of a plastic material, and for example, can be formed of one of polyethylene terephthalate (PET), polyethylenapthanate (PEN), polycarbonate (PC), polynorborneen (PNB), and polyethersulfone (PES). The flexible rear film 140 can be omitted.

Additionally, the foldable display apparatus according to an embodiment of the present disclosure can further include a touch screen for a user interface using a user touch, and the touch screen can be attached on the panel 100 or can be embedded in the panel 100 through a process of forming the pixel array.

Moreover, the foldable display apparatus according to an embodiment of the present disclosure can include, instead of the flexible circuit film 130, a signal application unit which extends from an edge of the panel 100 to have a certain width and length and is connected to a driving system, and in this case, the flexible circuit film 130 can be omitted.

The first frame 200 can support a first rear surface of the panel 100 overlapping the first display area DA1 of the panel 100. The first frame 200 according to an embodiment can include a first panel coupling surface 210 which is coupled to the first rear surface of the panel 100 by an adhesive member. The first frame 200 according to an embodiment can further include a first frame sidewall 230, provided in an edge other than an inner edge adjacent to the bending area BA of the panel 100 among edges of the first panel coupling surface 210, and a plurality of first housing coupling projections 250 protruding from the first panel coupling surface 210. The first frame sidewall 230 can surround each of side surfaces of the panel 100 disposed on the first panel coupling surface 210 to conceal each side surface of the panel 100. Each of the plurality of first housing coupling projections 250 can protrude from a rear edge of the first panel coupling surface 210 to have a certain height, and thus, can include a first coupling hole. For example, the plurality of first housing coupling projections 250 can be provided in the rear edge of the first panel coupling surface 210 adjacent to each of corners of the first panel coupling surface 210.

The second frame 300 can support a second rear surface of the panel 100 overlapping the second display area DA2 of the panel 100. The second frame 300 according to an embodiment can include a second panel coupling surface 310 which is coupled to the second rear surface of the panel 100 by an adhesive member. The second frame 300 according to an embodiment can further include a second frame sidewall 330, provided in an edge other than an inner edge adjacent to the bending area BA of the panel 100 among edges of the second panel coupling surface 310, and a plurality of second housing coupling projections 350 protruding from the second panel coupling surface 310. The second frame sidewall 330 can surround each of side surfaces of the panel 100 disposed on the second panel coupling surface 310 to conceal each side surface of the panel 100. Each of the plurality of second housing coupling projections 350 can protrude from a rear edge of the second panel coupling surface 310 to have a certain height, and thus, can include a second coupling hole. For example, the plurality of second housing coupling projections 350 can be provided in the rear edge of the second panel coupling surface 310 adjacent to each of corners of the second panel coupling surface 310.

The first housing 400 can accommodate the first frame 200 and can surround a rear surface of the first frame 200 and the first frame sidewall 230. The first housing 400 according to an embodiment can include a first housing plate 410 and a first housing sidewall 430. The first housing plate 410 can cover the rear surface of the first frame 200 and can support a portion of the system driver. The first housing sidewall 430 can be provided in an edge other than an inner edge adjacent to the bending area BA of the panel 100 among edges of a top of the first housing plate 410. The first housing sidewall 430 can be configured to have a certain height and can surround the first frame sidewall 230 of the first frame 200 supported by the first housing plate 410. A plurality of first frame fastening members can pass through the first housing sidewall 430 and can be respectively fastened to a plurality of first coupling holes respectively provided in the plurality of first housing coupling projections 250 provided in the first frame 200, and thus, the first housing 400 can be coupled to the first frame 200. Also, a plurality of first hinge fastening members can pass through an inner edge of a front surface of the first housing plate 410 and can be fastened to the hinge module 600, and thus, the first housing 400 can be coupled to the hinge module 600. In this case, a gap space which is provided between the front surface of the first housing plate 410 and the rear surface of the first frame 200 to correspond to a height of each of the plurality of first housing coupling projections 250 can be used as an accommodation space which accommodates a portion of the driving system.

The second housing 500 can accommodate the second frame 300 and can surround a rear surface of the second frame 300 and the second frame sidewall 330. The second housing 500 according to an embodiment can include a second housing plate 510 and a second housing sidewall 530. The second housing plate 510 can cover the rear surface of the second frame 300 and can support the other portion of the system driver. The second housing sidewall 530 can be provided in an edge other than an inner edge adjacent to the bending area BA of the panel 100 among edges of a top of the second housing plate 510. The second housing sidewall 530 can be configured to have a certain height and can surround the second frame sidewall 330 of the second frame 300 supported by the second housing plate 510. A plurality of second frame fastening members can pass through the second housing sidewall 530 and can be respectively fastened to a plurality of second coupling holes respectively provided in the plurality of second housing coupling projections 350 provided in the second frame 300, and thus, the second housing 500 can be coupled to the second frame 300. Also, a plurality of second hinge fastening members can pass through an inner edge of a front surface of the second housing plate 510 and can be fastened to the hinge module 600, and thus, the second housing 500 can be coupled to the hinge module 600. In this case, a gap space which is provided between the front surface of the second housing plate 510 and the rear surface of the second frame 300 to correspond to a height of each of the plurality of second housing coupling projections 350 can be used as an accommodation space which accommodates a portion of the driving system.

The plurality of first frame fastening members, the plurality of second frame fastening members, the plurality of first hinge fastening members, and the plurality of second hinge fastening members can each be a screw.

The hinge module 600 can be connected between the first housing 400 and the second housing 500, can support a third rear surface of the panel 100 overlapping the bending area BA of the panel 100, and can guide bending of the bending area BA. That is, the hinge module 600 can be connected between the first housing 400 and the second housing 500 so as to enable folding (folded or unfolded) and can flatly unfold the bending area BA of the panel 100 or can bend the bending area BA in a curve shape. The hinge module 600 can include a hinge folding path based on folding of the panel 100. The hinge folding path of the hinge module 600 according to the present disclosure can be set to be disposed between a center surface and a rear surface of the panel 100 based on the thickness direction of the panel 100. The panel 100 can include a panel folding path which is disposed between the front surface and the rear surface according to bending of the bending area BA, and the panel folding path can be defined as a bending path of a neutral surface provided in the bending area BA of the panel 100. Herein, the rear surface of the panel 100 can be supported by the hinge module 600, and the front surface of the panel 100 can be defined as a surface opposite to the rear surface. Therefore, the hinge folding path of the hinge module 600 and the panel folding path of the panel 100 can be set in parallel on the same plane. Accordingly, in a folding operation of the panel 100, a bending stress applied to the bending area BA of the panel 100 is minimized, and thus, a crack caused by the bending stress does not occur in the bending area BA of the panel 100, thereby enhancing the reliability of the panel 100.

Additionally, the foldable display apparatus according to an embodiment of the present disclosure can further include an unfolded angle control module 700, a first front cover 800, and a second front cover 900.

The unfolded angle control module 700 can pass through the hinge module 600 and can be connected between the first housing 400 and the second frame 300, and in folding of the panel 100, the unfolded angle control module 700 can control an unfolded angle of the panel 100. That is, the unfolded angle control module 700 can set a folded angle or an unfolded angle of the panel 100 to an angle desired by a user. The unfolded angle control module 700 according to an embodiment can be slidably connected between the first housing 400 and the second frame 300 and can incrementally control an unfolded angle of the panel 100, based on a variation of a frictional force which is generated by sliding when folding of the panel 100 is performed.

Optionally, the unfolded angle control module 700 can pass through the hinge module 600 and can be connected between the first housing 400 and the second housing 500, or can pass through the hinge module 600 and can be connected between the first frame 200 and the second frame 300. As a result, one side of the unfolded angle control module 700 can be connected to one of the first frame 200 and the first housing 400, and the other side can pass through the hinge module 600 and can be connected to one of the second frame 300 and the second housing 500.

The unfolded angle control module 700 according to an embodiment can include first and second free stop modules 710 and 730. Each of the first and second free stop modules 710 and 730 can pass through the hinge module 600 and can be connected between the first housing 400 and the second frame 300, and can incrementally control an unfolded angle of the panel 100, based on a variation of a frictional force which is generated by sliding when folding of the panel 100 is performed.

The first front cover 800 can be coupled to the first frame 200 and can cover a first front edge adjacent to the first display area DA1 of the panel 100. That is, the first front cover 800 can cover only a left edge, a right edge, and a lower edge of the first display area DA1 other than the bending area BA, and thus, can conceal a non-display area near the first display area DA1. For example, the first front cover 800 may cover all the edges of the first display area DA1 other than the edge adjacent to the bending area BA Additionally, the first front cover 800 can include a buffer pad 810 disposed in a lower corner thereof. The buffer pad 810 can reduce an impact caused by a contact between the first front cover 800 and the second front cover 900 when folding of the panel 100 is performed.

The second front cover 900 can be coupled to the second frame 300 and can cover a second front edge adjacent to the second display area DA2 of the panel 100. That is, the second front cover 900 can cover only a left edge, a right edge, and an upper edge of the second display area DA2 other than the bending area BA, and thus, can conceal a non-display area near the second display area DA2. For example, the second front cover 900 may cover all the edges of the second display area DA2 other than the edge adjacent to the bending area BA.

As described above, in the foldable display apparatus according to an embodiment of the present disclosure, since the hinge folding path of the hinge module 600 is disposed between the front surface and the rear surface of the panel 100, a bending stress applied to the bending area BA of the panel 100 is minimized in a folding operation of the panel 100, and thus, a crack caused by the bending stress does not occur or is minimized in the bending area BA of the panel 100, thereby enhancing the reliability of the panel 100. Also, in the foldable display apparatus according to an embodiment of the present disclosure, an unfolded angle of the panel 100 can be incrementally controlled by the unfolded angle control module 700, and thus, a folded angle or an unfolded angle of the panel 100 can be set to an angle desired by a user.

Figure 3:
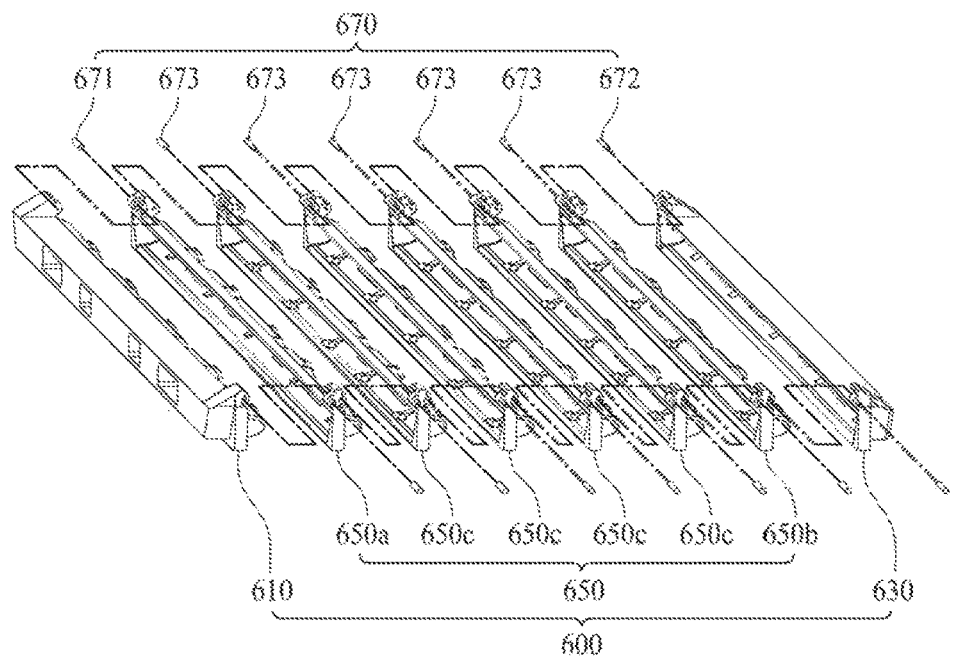
FIG. 3 is an exploded perspective view of a hinge module illustrated in FIG. 2.

FIG. 3 is an exploded perspective view of the hinge module illustrated in FIG. 2.

Referring to FIGS. 2 and 3, the hinge module 600 according to an embodiment of the present disclosure can include a plurality of hinge segments 610, 630, and 650 and a plurality of hinge shafts 670.

Each of the plurality of hinge segments 610, 630, and 650 can directly support the bending area BA of the panel 100. The plurality of hinge segments 610, 630, and 650 can be disposed in parallel along a first direction X in order for one sides thereof to overlap. Here, the first direction X can be defined as a direction parallel to a long side (or a widthwise direction) of the panel 100.

A first hinge segment 610 of the plurality of hinge segments 610, 630, and 650 can be fixed to the first housing 400. That is, the first hinge segment 610 can be fixed to an inner edge of a front surface of the first housing plate 410 by each of a plurality of first hinge fastening members. In this case, each of the plurality of first hinge fastening members can be a screw which passes through the inner edge of the front surface of the first housing plate 410 and is fastened to a rear surface of the first hinge segment 610.

A second hinge segment 630 of the plurality of hinge segments 610, 630, and 650 can be fixed to the second housing 500. That is, the second hinge segment 630 can be fixed to an inner edge of a front surface of the second housing plate 510 by each of a plurality of second hinge fastening members. In this case, each of the plurality of second hinge fastening members can be a screw which passes through the inner edge of the front surface of the second housing plate 510 and is fastened to a rear surface of the second hinge segment 630.

The hinge segment 650 other than the first and second hinge segments 610 and 630 of the plurality of hinge segments 610, 630, and 650 can be defined as a plurality of intermediate segments, and the first and second hinge segments 610 and 630 can rotate or can be folded about the hinge shaft 670 used as a rotational shaft to fold the bending area BA of the panel 100.

Each of the plurality of hinge shafts 670 can rotatably support two hinge segments which are adjacent to each other along the first direction X. For example, a first hinge shaft 671 of the plurality of hinge shafts 670 can rotatably support the first hinge segment 610 and a next hinge segment 650a (a first intermediate segment) adjacent to the first hinge segment 610. A second hinge shaft 672 of the plurality of hinge shafts 670 can rotatably support a second hinge segment 630 and a previous hinge segment 650b (a second intermediate segment) adjacent to the second hinge segment 630. Each of a plurality of hinge shafts 673 (a plurality of intermediate hinge shafts) other than the first and second hinge shafts 671 and 672 among the plurality of hinge shafts 670 can rotatably support two adjacent hinge segments 650c (a plurality of third intermediate segments) other than the first and second hinge shafts 671 and 672. A center of each of the plurality of hinge shafts 670 can be always disposed between the front surface and the rear surface of the panel 100 and can move along the hinge folding path according to folding of the hinge module 600, thereby minimizing a bending stress which is applied to the bending area BA of the panel 100 when folding of the panel 100 is performed.

The plurality of hinge segments 610, 630, and 650 can be rotatably connected to one another by the plurality of hinge shafts 670, can support the bending area BA of the panel 100 which is unfolded in a planar state according to folding of the panel 100, and can provide a bending space having a curve shape (or a Q-shape) in order for the bending area BA of the panel 100 to be bent in a curve shape having a certain curvature radius.

Figure 4A:
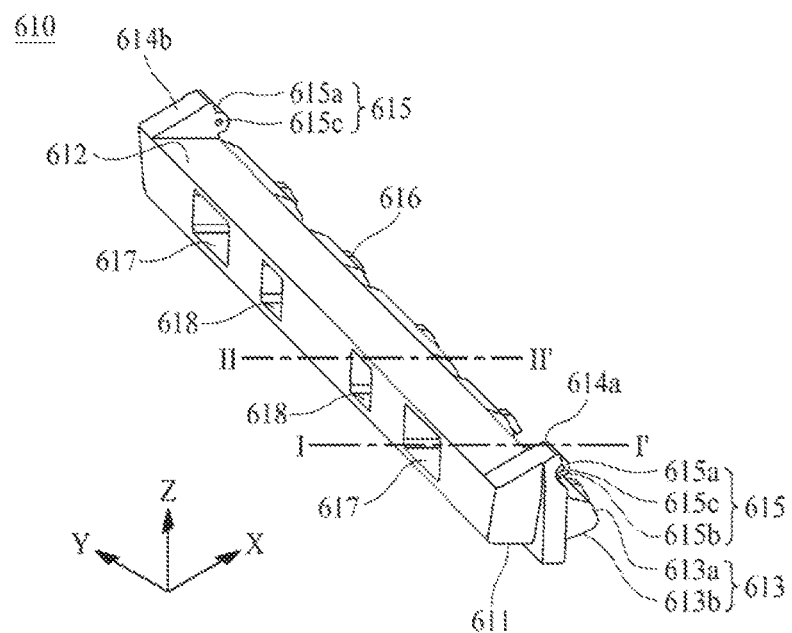
FIG. 4A is an enlarged view of a first hinge segment illustrated in FIG. 3.
Figure 4B:
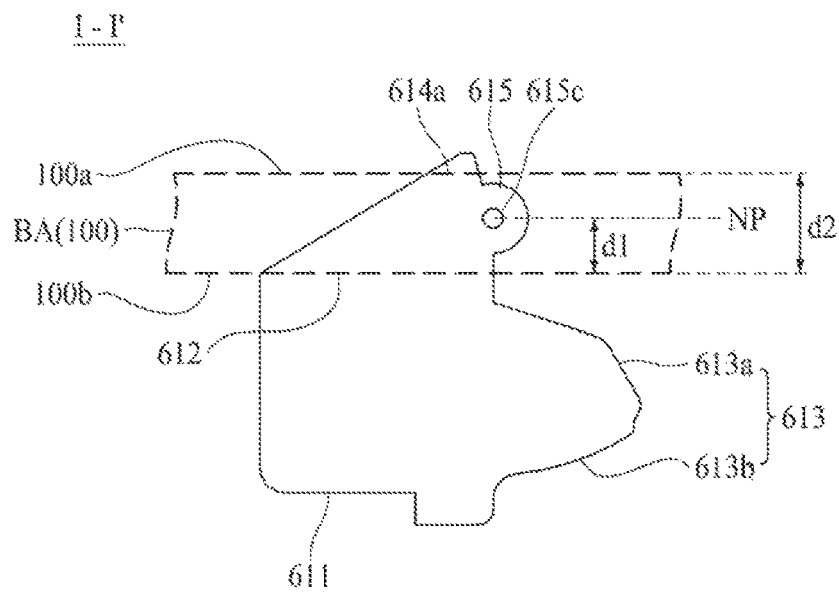
FIG. 4B is a cross-sectional view taken along line I-I' illustrated in FIG. 4A.
Figure 4C:
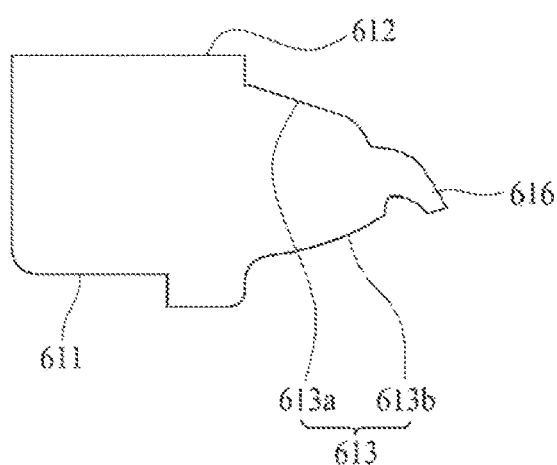
FIG. 4C is a cross-sectional view taken along line II-IP illustrated in FIG. 4A.

FIG. 4A is an enlarged view of the first hinge segment illustrated in FIG. 3, FIG. 4B is a cross-sectional view taken along line I-I' illustrated in FIG. 4A, and FIG. 4C is a cross-sectional view taken along line II-II' illustrated in FIG. 4A.

Referring to FIGS. 3 and 4A to 4C, the first hinge segment 610 according to an embodiment of the present disclosure can include a first body 611, a first panel supporting surface 612, a first side protrusion 613, a pair of first skirts 614a and 614b, and a first segment connector 615.

The first body 611 can have a bar shape which long extends along a second direction Y. Here, the second direction Y can be defined as a direction parallel to a short side (or a lengthwise direction) of the panel 100. The first body 611 can have a length which is greater than that of the bending area BA of the panel 100, with respect to the second direction Y. The first body 611 can be fixed to the inner edge of the front surface of the first housing plate 410 by each of the plurality of first hinge fastening members.

The first panel supporting surface 612 can be provided on a front surface of the first body 611 and can support the bending area BA of the panel 100. That is, the first panel supporting surface 612 can be provided as a flat surface provided on a front surface of the first body 611 and can directly support a rear surface 100b of the panel 100 overlapping the bending area BA of the panel 100.

The first side protrusion 613 can protrude from one sidewall of the first body 611. That is, the first side protrusion 613 can protrude in a direction from one sidewall of the first body 611 to a next hinge segment (a first intermediate segment) adjacent thereto along the first direction X. The first side protrusion 613 according to an embodiment can include a cross-sectional surface having a curve shape so that the first intermediate segment 650a connected to the first hinge segment 610 rotate smoothly about the first hinge shaft 671. For example, the first side protrusion 613 can include a first upper curve part 613a and a first lower curve part 613b which protrude in a curve shape. The first upper curve part 613a and the first lower curve part 613b can have a vertically asymmetrical structure with respect to a height direction Z of the first body 611. A connector between the first upper curve part 613a and the first lower curve part 613b can be disposed in a lower portion corresponding to half of a height of the first body 611. The first side protrusion 613 can be inserted into an adjacent first intermediate segment 650a.

The pair of first skirts 614a and 614b can respectively protrude from one side and the other side of a front surface of the first body 611 so as to be parallel to each other with the first panel supporting surface 612 therebetween. That is, the pair of first skirts 614a and 614b can vertically protrude from both edges of the first body 611 to have a certain height with respect to the second direction Y and can directly face both side surfaces of the panel 100 supported by the first panel supporting surface 612. In this case, a height of each of the pair of first skirts 614a and 614b can be greater than a thickness of the panel 100. Also, in the pair of first skirts 614a and 614b, one side facing a next hinge segment and the other side facing the first housing can each be provided as an inclined surface.

The first segment connector 615 can be provided on one side of each of the pair of first skirts 614a and 614b and can support the first hinge shaft 671. The first segment connector 615 according to an embodiment can include a first connector 615a and a first rotation guide groove 615b.

The first connector 615a can protrude from the one side of each of the pair of first skirts 614a and 614b. The first connector 615a can protrude to have a cross-sectional surface having a circular shape, for mutual rotation between the first hinge segment 610 and a next hinge segment. The first connector 615a can include a first shaft inserting hole 615c provided in a center thereof, and the first shaft inserting hole 615c can be provided to pass through the first connector 615a along the second direction Y.

A center of the first shaft inserting hole 615c can be disposed between a front surface 100a and the rear surface 100b of the panel 100, as shown in FIG. 4B. That is, a first distance d1 between the center of the first shaft inserting hole 615c and the first panel supporting surface 612 can be less than a second distance d2 between the first panel supporting surface 612 and the front surface 100a of the panel 100. In detail, the first distance d1 between the center of the first shaft inserting hole 615c and the first panel supporting surface 612 can be the same as a distance between a neutral surface NP provided in the bending area BA of the panel 100 and the first panel supporting surface 612.

The first rotation guide groove 615b can be provided concavely from one side of each of the pair of first skirts 614a and 614b adjacent to the first connector 615a. That is, the first rotation guide groove 615b can be provided in parallel with the first connector 615a along the second direction Y. For example, the first rotation guide groove 615b can be provided outside the first connector 615a. The first rotation guide groove 615b can be concavely provided to have a cross-sectional surface having a semicircular shape, for mutual rotation between the first hinge segment 610 and a next hinge segment.

The first hinge segment 610 according to an embodiment of the present disclosure can further include a plurality of first stoppers 616.

The plurality of first stoppers 616 can be provided in the first side protrusion 613 and can be arranged at certain intervals along the second direction Y. The plurality of first stoppers 616 according to an embodiment can each have a hook shape. For example, the plurality of first stoppers 616 can each include a vertical part, which protrudes from the first side protrusion 613, and a bent part which is bent in a direction from an end of the vertical part to a rear surface of the first body 611. Each of the plurality of first stoppers 616 can restrict a maximum rotation angle of a next hinge segment when mutual rotation between the first hinge segment 610 and the next hinge segment is performed.

The first hinge segment 610 according to an embodiment of the present disclosure can further include at least one first hollow part 617 and at least one first cable-through hole 618, as shown in FIG. 4A.

The at least one first hollow part 617 can be provided to pass through the first body 611 and the first side protrusion 613 along the first direction X. At least one free stop module described above can be slidably disposed in the at least one first hollow part 617.

At least one cable, which connects a portion of the system driver supported by the first housing to the other portion of the system driver supported by the second housing, can be disposed in the at least one first cable-through hole 618.

Figure 5A:
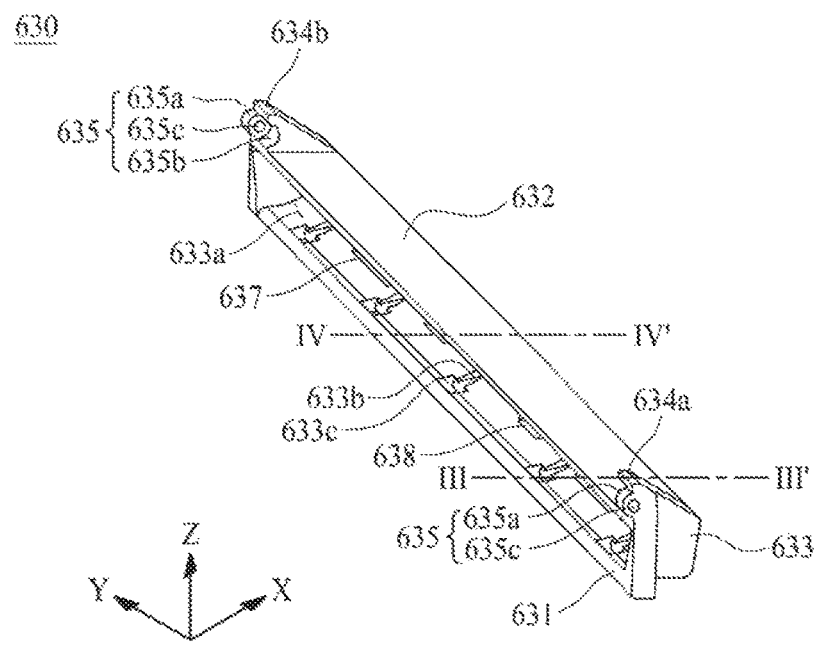
FIG. 5A is an enlarged view of a second hinge segment illustrated in FIG. 3.
Figure 5B:
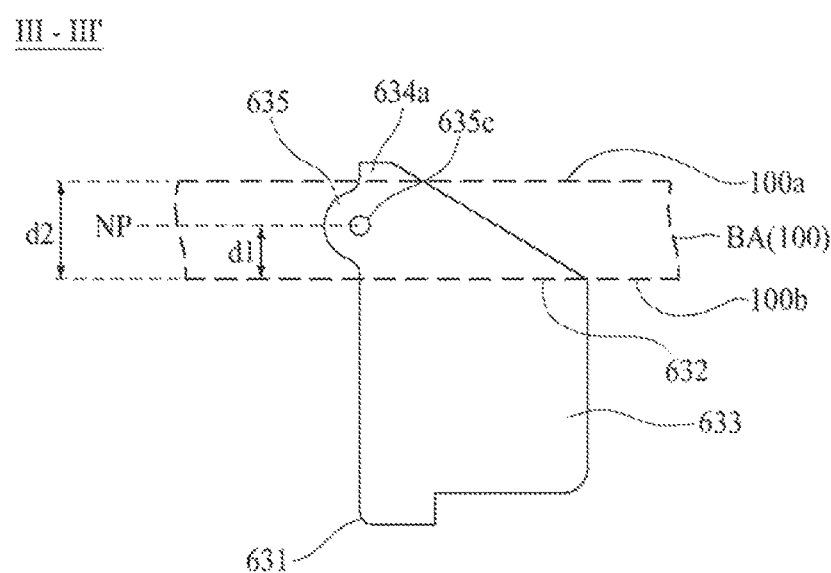
FIG. 5B is a cross-sectional view taken along line illustrated in FIG. 5A.
Figure 5C:
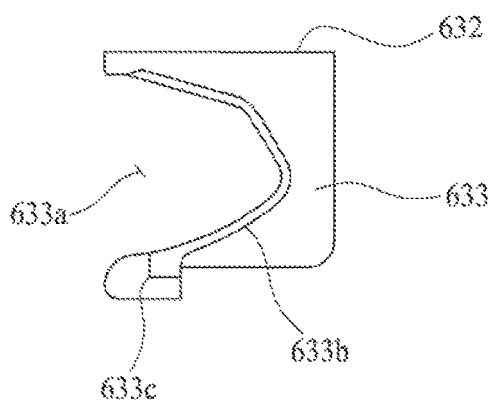
FIG. 5C is a cross-sectional view taken along line IV-IV' illustrated in FIG. 5A.

FIG. 5A is an enlarged view of the second hinge segment illustrated in FIG. 3, FIG. 5B is a cross-sectional view taken along line illustrated in FIG. 5A, and FIG. 5C is a cross-sectional view taken along line IV-IV' illustrated in FIG. 5A.

Referring to FIGS. 3 and 5A to 5C, the second hinge segment 630 according to an embodiment of the present disclosure can include a second body 631, a second panel supporting surface 632, a second side protrusion 633, a pair of second skirts 634a and 634b, and a second segment connector 635.

The second body 631 can have a frame shape which long extends along the second direction Y and includes an opened center. The second body 631 can have a length which is greater than that of the bending area BA of the panel 100, with respect to the second direction Y.

The second panel supporting surface 632 can be provided on a front surface of the second body 631 and can support the bending area BA of the panel 100. That is, the second panel supporting surface 632 can be provided as a flat surface provided on a front surface of the second body 631 and can directly support a rear surface 100b of the panel 100 overlapping the bending area BA of the panel 100.

The second side protrusion 633 can protrude to have a first accommodation groove 633a which is provided concavely from one sidewall of the second body 631. That is, the second side protrusion 633 can protrude from the one sidewall of the second body 631 to the second housing along the first direction X. The second side protrusion 633 can be fixed to the inner edge of a front surface of the second housing plate 510 by each of the plurality of second hinge fastening members.

The pair of second skirts 634a and 634b can respectively protrude from one side and the other side of a front surface of the second body 631 so as to be parallel to each other with the second panel supporting surface 632 therebetween. That is, the pair of second skirts 634a and 634b can vertically protrude from both edges of the second body 631 to have a certain height with respect to the second direction Y and can directly face both side surfaces of the panel 100 supported by the second panel supporting surface 632. In this case, a height of each of the pair of second skirts 634a and 634b can be greater than a thickness of the panel 100. Also, in the pair of second skirts 634a and 634b, one side facing the second housing and the other side facing a previous hinge segment adjacent thereto can each be provided as an inclined surface. For example, with respect to a plurality of intermediate segments, the pair of second skirts 634a and 634b can have a cross-sectional structure which is symmetrical with the pair of first skirts 614a and 614b.

The second segment connector 635 can be provided on the other side of each of the pair of second skirts 634a and 634b and can support the second hinge shaft 672. The second segment connector 635 according to an embodiment can include a second connector 635a and a second rotation guide groove 635b.

The second connector 635a can protrude from the other side of each of the pair of second skirts 634a and 634b. The second connector 635a can protrude to have a cross-sectional surface having a circular shape, for mutual rotation between the second hinge segment 630 and a previous hinge segment. The second connector 635a can include a second shaft inserting hole 635c provided in a center thereof, and the second shaft inserting hole 635c can be provided to pass through the second connector 635a along the second direction Y.

A center of the second shaft inserting hole 635c can be disposed between a front surface 100a and the rear surface 100b of the panel 100. That is, a first distance d1 between the center of the second shaft inserting hole 635c and the second panel supporting surface 632 can be less than a second distance d2 between the second panel supporting surface 632 and the front surface 100a of the panel 100. In detail, the first distance d1 between the center of the second shaft inserting hole 635c and the second panel supporting surface 632 can be the same as a distance between a neutral surface NP provided in the bending area BA of the panel 100 and the second panel supporting surface 632.

The second rotation guide groove 635b can be provided concavely from the other side of each of the pair of second skirts 634a and 634b adjacent to the second connector 635a. That is, the second rotation guide groove 635b can be provided in parallel with the second connector 635a along the second direction Y. For example, the second rotation guide groove 635b can be provided outside the second connector 635a. The second rotation guide groove 635b can be concavely provided to have a cross-sectional surface having a semicircular shape, for mutual rotation between the second hinge segment 630 and a previous hinge segment.

The second hinge segment 630 according to an embodiment of the present disclosure can include a plurality of first guide slits 633b and a first stepped part 633c.

The plurality of first guide slits 633b can be provided in the second side protrusion 633 and can be arranged at certain intervals along the second direction Y. The plurality of first guide slits 633b according to an embodiment can be concavely provided along an inner surface of the second side protrusion 633 to have a certain width and can provide a curve-shaped guide path corresponding to a shape of the second side protrusion 633. Here, the inner surface of the second side protrusion 633 can be defined as an inner wall facing the first accommodation groove 633a. The plurality of first guide slits 633b can be spaced apart from the plurality of stoppers 616, respectively. Each of the plurality of first guide slits 633b can guide a rotation of a previous hinge segment when mutual rotation between the second hinge segment 630 and the previous hinge segment is performed.

The first stepped part 633c can be provided on a rear surface of the second body 631 and can communicate with each of the plurality of first guide slits 633b. That is, the first stepped part 633c can be concavely provided between the rear surface of the second body 631 and the second side protrusion 633 to have a stepped surface. The first stepped part 633c can restrict a maximum rotation angle of the previous hinge segment when mutual rotation between the second hinge segment 630 and the previous hinge segment is performed.

The second hinge segment 630 according to an embodiment of the present disclosure can further include at least one second hollow part 637 and at least one second cable-through hole 638.

The at least one second hollow part 637 can be provided to pass through the second side protrusion 633 along the first direction X and can communicate with the at least one first hollow part 617 provided in the first hinge segment. At least one free stop module described above can be slidably disposed in the at least one second hollow part 637.

At least one cable, which connects a portion of the system driver supported by the first housing to the other portion of the system driver supported by the second housing, can be disposed in the at least one second cable-through hole 618. The second cable-through hole 638 can communicate with the at least one first cable-through hole 618 provided in the first hinge segment.

Figure 6A:
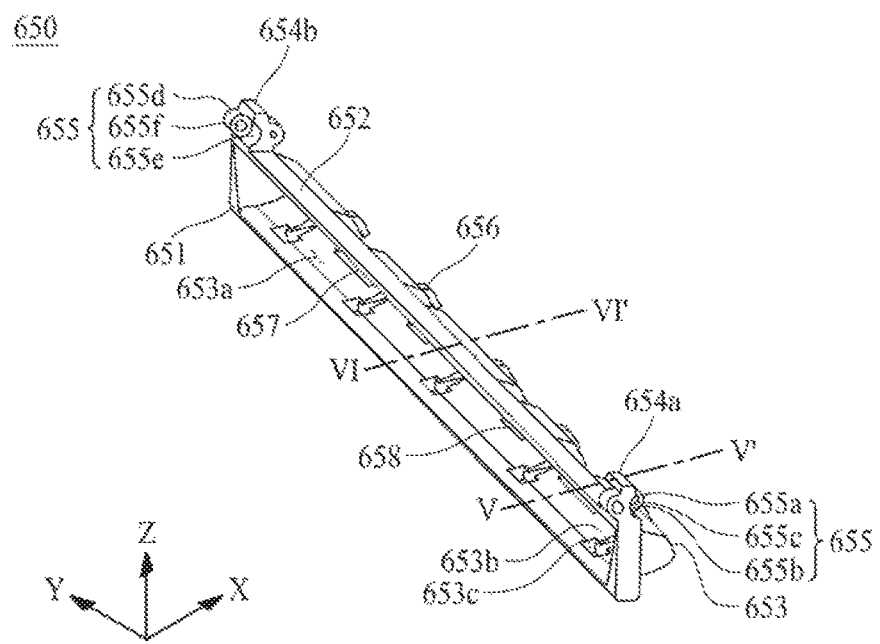
FIG. 6A is an enlarged view of one of a plurality of intermediate segments illustrated in FIG. 3.
Figure 6B:
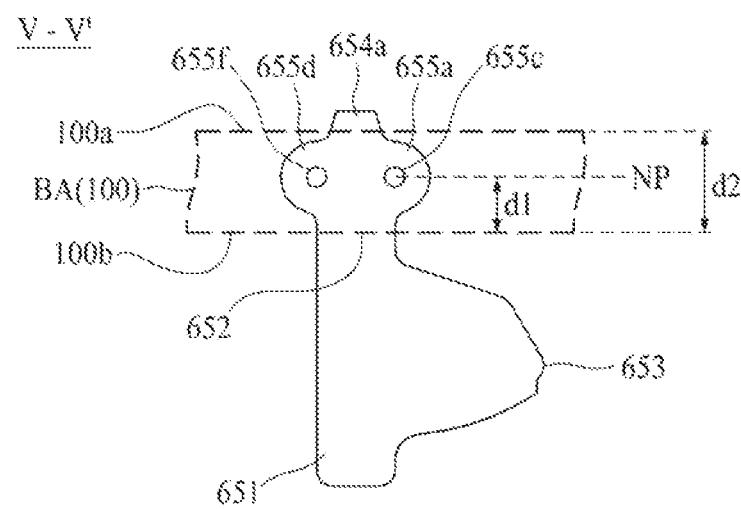
FIG. 6B is a cross-sectional view taken along line V-V' illustrated in FIG. 6A.
Figure 6C:
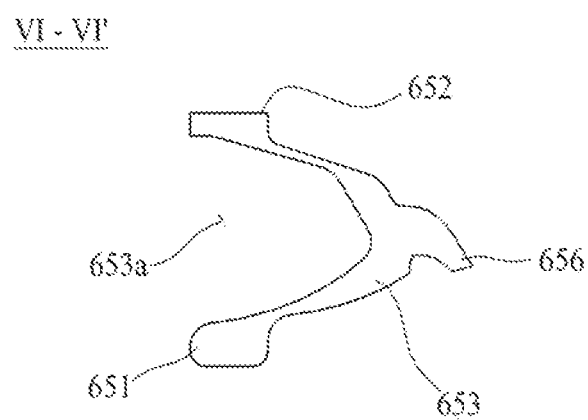
FIG. 6C is a cross-sectional view taken along line VI-VI' illustrated in FIG. 6A.

FIG. 6A is an enlarged view of one of the plurality of intermediate segments illustrated in FIG. 3, FIG. 6B is a cross-sectional view taken along line V-V' illustrated in FIG. 6A, and FIG. 6C is a cross-sectional view taken along line VI-VI' illustrated in FIG. 6A.

Referring to FIGS. 3 and 6A to 6C, the intermediate segment 650 according to an embodiment of the present disclosure can include a third body 651, a third panel supporting surface 652, a third side protrusion 653, a pair of third skirts 654a and 654b, and a third segment connector 655.

The third body 651 can have a frame shape which long extends along the second direction Y and includes an opened center. The third body 651 can have a length which is greater than that of the bending area BA of the panel 100, with respect to the second direction Y.

The third panel supporting surface 652 can be provided on a front surface of the third body 651 and can support the bending area BA of the panel 100. That is, the third panel supporting surface 652 can be provided as a flat surface provided on a front surface of the third body 651 and can directly support a rear surface 100b of the panel 100 overlapping the bending area BA of the panel 100.

The third side protrusion 653 can protrude to have a second accommodation groove 653a which is provided concavely from one sidewall of the third body 651. That is, the third side protrusion 653 can protrude from the one sidewall of the third body 651 to a next hinge segment adjacent thereto along the first direction X.

The pair of third skirts 654a and 654b can respectively protrude from one side and the other side of a front surface of the third body 651 so as to be parallel to each other with the third panel supporting surface 652 therebetween. That is, the pair of third skirts 654a and 654b can vertically protrude from both edges of the third body 651 to have a certain height with respect to the second direction Y and can directly face both side surfaces of the panel 100 supported by the third panel supporting surface 652. In this case, a height of each of the pair of third skirts 654a and 654b can be greater than a thickness of the panel 100. Also, in the pair of third skirts 654a and 654b, one side facing a next hinge segment adjacent thereto and the other side facing a previous hinge segment adjacent thereto can each be provided as an inclined surface. For example, a cross-sectional surface of each of the pair of third skirts 654a and 654b can be a cross-sectional surface having a trapezoid shape with respect to the first direction X.

The third segment connector 655 can be provided on one side and the other side of each of the pair of third skirts 654a and 654b and can support the third hinge shaft 673. The third segment connector 655 according to an embodiment can include a third connector 655a, a third rotation guide groove 655b, a fourth connector 655d, and a fourth rotation guide groove 655e.

The third connector 655a can protrude from the one side of each of the pair of third skirts 654a and 654b. The third connector 655a can protrude to have a cross-sectional surface having a circular shape, for mutual rotation between two adjacent intermediate segments. The third connector 655a can include a third shaft inserting hole 655c provided in a center thereof, and the third shaft inserting hole 655c can be provided to pass through the third connector 655a along the second direction Y.

A center of the third shaft inserting hole 655c can be disposed between a front surface 100a and the rear surface 100b of the panel 100. That is, a first distance d1 between the center of the third shaft inserting hole 655c and the third panel supporting surface 652 can be less than a second distance d2 between the third panel supporting surface 652 and the front surface 100a of the panel 100. In detail, the first distance d1 between the center of the third shaft inserting hole 655c and the third panel supporting surface 652 can be the same as a distance between a neutral surface NP provided in the bending area BA of the panel 100 and the third panel supporting surface 652.

The third rotation guide groove 655b can be provided concavely from the one side of each of the pair of third skirts 654a and 654b adjacent to the third connector 655a. That is, the third rotation guide groove 655b can be provided in parallel with the third connector 655a along the second direction Y. For example, the third rotation guide groove 655b can be provided outside the third connector 655a. The third rotation guide groove 655b can be concavely provided to have a cross-sectional surface having a semicircular shape, for mutual rotation between two adjacent intermediate segments.

The fourth connector 655d can protrude from the other side of each of the pair of third skirts 654a and 654b. The fourth connector 655d can protrude to have a cross-sectional surface having a circular shape, for mutual rotation between two adjacent intermediate segments. The fourth connector 655d can include a fourth shaft inserting hole 655f provided in a center thereof, and the fourth shaft inserting hole 655f can be provided to pass through the fourth connector 655d along the second direction Y.

A center of the fourth shaft inserting hole 655f can be disposed between the front surface 100a and the rear surface 100b of the panel 100. That is, a first distance d1 between the center of the fourth shaft inserting hole 655f and the third panel supporting surface 652 can be less than the second distance d2 between the third panel supporting surface 652 and the front surface 100a of the panel 100. In detail, the first distance d1 between the center of the fourth shaft inserting hole 655f and the third panel supporting surface 652 can be the same as the distance between the neutral surface NP provided in the bending area BA of the panel 100 and the third panel supporting surface 652.

Herein, a first hinge shaft 671 of the plurality of hinge shafts 670 is commonly inserted into the first shaft inserting hole 615c and a fourth shaft inserting hole 655f of a first intermediate segment 650a, which is adjacent to the first hinge segment 610, of the plurality of intermediate segments 650. A second hinge shaft 672 of the plurality of hinge shafts 670 is commonly inserted into the second shaft inserting hole 635c and a third shaft inserting hole 655c of a second intermediate segment 650b, which is adjacent to the second hinge segment 630, of the plurality of intermediate segments 650. Each of intermediate hinge shafts 673 of the plurality of hinge shafts 670 except the first and second hinge shafts 671 and 672 is commonly inserted into the third shaft inserting hole 655c and the fourth shaft inserting hole 655f of adjacent intermediate segments 650.

The fourth rotation guide groove 655e can be provided concavely from the other side of each of the pair of third skirts 654a and 654b adjacent to the fourth connector 655d. That is, the fourth rotation guide groove 655e can be provided in parallel with the fourth connector 655d along the second direction Y. For example, the fourth rotation guide groove 655e can be provided outside the fourth connector 655d. The fourth rotation guide groove 655e can be concavely provided to have a cross-sectional surface having a semicircular shape, for mutual rotation between two adjacent intermediate segments.

The plurality of intermediate segments 650 according to an embodiment of the present disclosure can each include a plurality of second guide slits 653b and a second stepped part 653c.

The plurality of second guide slits 653b can be provided in the third side protrusion 653 and can be arranged at certain intervals along the second direction Y. The plurality of second guide slits 653b according to an embodiment can be concavely provided along an inner surface of the third side protrusion 653 to have a certain width and can provide a curve-shaped guide path corresponding to a shape of the third side protrusion 653. Here, the inner surface of the third side protrusion 653 can be defined as an inner wall facing the second accommodation groove 653a. The plurality of second guide slits 653b can be spaced apart from the plurality of stoppers 656, respectively. Each of the plurality of second guide slits 653b can guide a rotation of a previous hinge segment when mutual rotation between two adjacent intermediate segments is performed.

The second stepped part 653c can be provided on a rear surface of the third body 651 and can communicate with each of the plurality of second guide slits 653b. That is, the second stepped part 653c can be concavely provided between the rear surface of the third body 651 and the third side protrusion 653 to have a stepped surface. The second stepped part 653c can restrict a maximum rotation angle of the previous hinge segment when mutual rotation between two adjacent intermediate segments is performed.

The intermediate segment 650 according to an embodiment of the present disclosure can further include a plurality of second stoppers 656.

The plurality of second stoppers 656 can be provided in the third side protrusion 653 and can be arranged at certain intervals along the second direction Y. The plurality of second stoppers 656 according to an embodiment can each have a hook shape. For example, the plurality of second stoppers 656 can each include a vertical part, which protrudes from the third side protrusion 653, and a bent part which is bent in a direction from an end of the vertical part to a rear surface of the third body 651. Each of the plurality of second stoppers 656 can restrict a maximum rotation angle of a next intermediate segment when mutual rotation between two adjacent intermediate segments is performed.

Each of the plurality of intermediate segments according to an embodiment of the present disclosure can further include at least one third hollow part 657 and at least one third cable-through hole 658.

The at least one third hollow part 657 can be provided to pass through the third side protrusion 653 along the first direction X and can communicate with the at least one first hollow part 617 provided in the first hinge segment and the at least one second hollow part 637 provided in the second hinge segment. At least one free stop module described above can be slidably disposed in the at least one third hollow part 657.

At least one cable, which connects a portion of the system driver supported by the first housing to the other portion of the system driver supported by the second housing, can be disposed in the at least one third cable-through hole 658. The third cable-through hole 658 can communicate with the at least one first cable-through hole 618 provided in the first hinge segment and the at least one second cable-through hole 638 provided in the second hinge segment.

Figure 7:
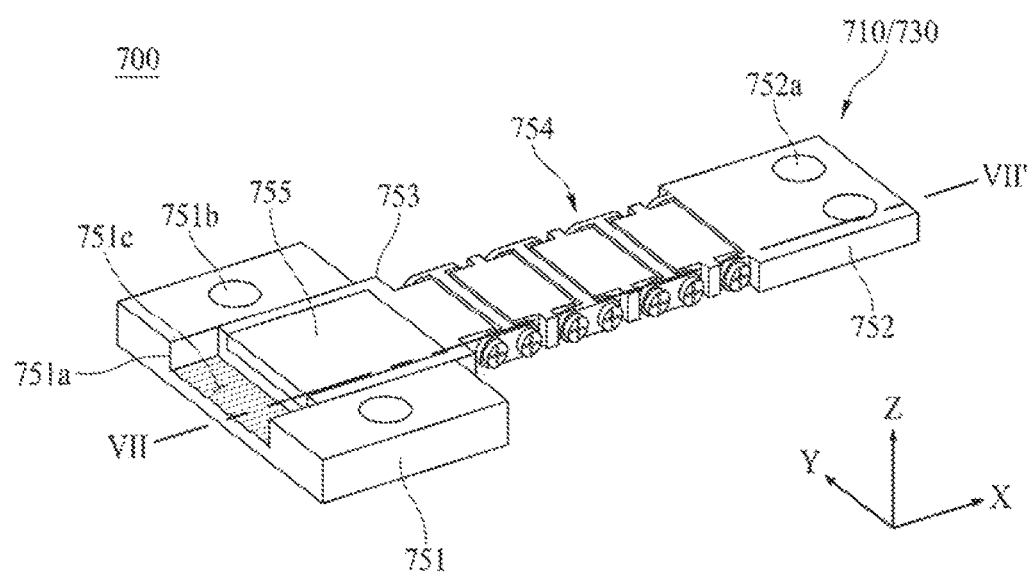
FIG. 7 is a diagram for describing an unfolded angle control module illustrated in FIG. 2.
Figure 8:
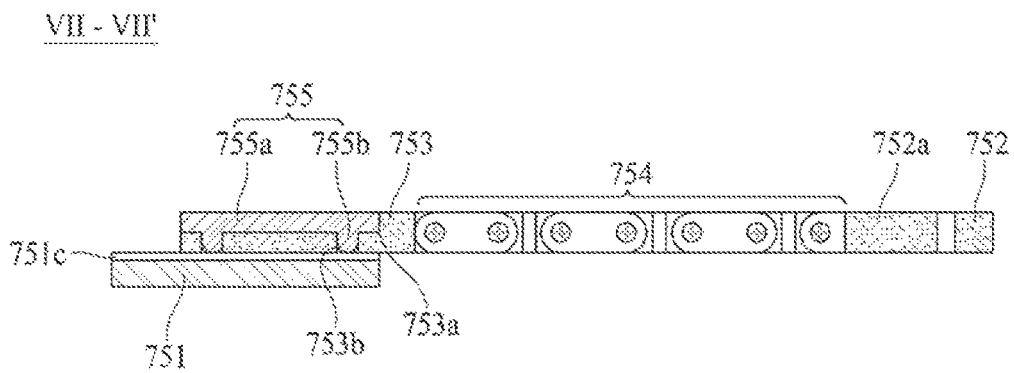
FIG. 8 is a cross-sectional view taken along line VII-VII' illustrated in FIG. 7.

FIG. 7 is a diagram for describing the unfolded angle control module illustrated in FIG. 2, and FIG. 8 is a cross-sectional view taken along line VII-VII' illustrated in FIG. 7.

Referring to FIGS. 2, 7, and 8, the first and second free stop modules 710 and 730 of the unfolded angle control module 700 according to an embodiment of the present disclosure can each include a guide block 751, a fixing block 752, a sliding block 753, and a chain 754.

The guide block 751 can be installed in the first housing 400 and can guide sliding of the sliding block 753 when folding of the panel 100 is performed. The guide block 751 according to an embodiment can include a guide groove 751a and a plurality of first vertical holes 751b. The guide groove 751a can be recessed from a center of the guide block 751 to have a certain depth. The guide groove 751a can guide sliding of the sliding block 753 when folding of the panel 100 is performed. The plurality of first vertical holes 751b can be provided to vertically pass through both edges of the guide block 751 with the guide groove 751a therebetween. The guide block 751 can be fixed to the first housing plate 410 of the first housing 400 by a plurality of first block fixing members.

Each of the plurality of first block fixing members according to an embodiment can be a screw or a bolt which passes through an inner edge of a front surface of the first housing plate 410 and is fastened to each of the plurality of first vertical holes 751b provided in the guide block 751.

According to another embodiment, the plurality of first block fixing members can be a plurality of first bosses which are provided in the inner edge of the front surface of the first housing plate 410 and are respectively inserted into the first vertical holes 751b of the guide block 751, and in this case, the plurality of first bosses can be respectively inserted into the first vertical holes 751b of the guide block 751 and can fix the guide block 751 to the first housing 400. Additionally, a screw can be fastened to a first boss inserted into a corresponding first vertical hole 751b of the first vertical holes 751b of the guide block 751, thereby preventing the guide block 751 from deviating from the first boss.

Additionally, the guide block 751 can include a concave-convex structure 751c. The concave-convex structure 751c can include a plurality of block parts provided on an upper surface of the guide groove 751a of the guide block 751. The plurality of block parts can long extend along the first direction X and can be arranged in parallel along the second direction Y. Each of the plurality of block parts can include a cross-sectional surface having a curve shape, with respect to the second direction Y. The guide block 751 increases a roughness of the upper surface of the guide groove 751a.

The fixing block 752 can be installed in the second frame 300. That is, the fixing block 752 can be fixed to a rear surface of an inner edge of the second panel coupling surface 310 provided in the second frame 300 by using a plurality of second block fixing members 752a. The fixing block 752 according to an embodiment can include a plurality of second vertical holes 752a. The plurality of second vertical holes 752a can be provided to vertically pass through both edges of the fixing block 752.

The plurality of second block fixing members 752a can be a plurality of second bosses which are provided on the rear surface of the inner edge of the second panel coupling surface 310, and in this case, the plurality of second bosses can be respectively inserted into the second vertical holes 752a of the fixing block 752 and can fix the fixing block 752 to the second frame 300. Additionally, a screw can be fastened to a second boss inserted into a corresponding second vertical hole 752a of the second vertical holes 752a of the fixing block 752, thereby preventing the fixing block 752 from deviating from the second boss.

The sliding block 753 can be movably disposed in the guide block 751. The sliding block 753 can be disposed in the guide groove 751a of the guide block 751 and can slide in the guide groove 751a when folding of the chain 754 is performed.

The chain 754 can pass through the hinge module 600 and can be connected between the fixing block 752 and the sliding block 753. One side of the chain 754 can be rotatably connected to the fixing block 752, and the other side of the chain 754 can pass through a hollow part provided in the hinge module 600 and can be rotatably installed in the sliding block 753. The chain 754 according to an embodiment can include a plurality of chain blocks which are rotatably connected to each other.

Each of the first and second free stop modules 710 and 730 can incrementally control an unfolded angle of the panel 100, based on a variation of a frictional force which is generated between the sliding block 752 and the guide block 751 by sliding of the sliding block 752 when folding of the panel 100 is performed. Particularly, each of the first and second free stop modules 710 and 730 can be configured so that a frictional force is additionally generated between the sliding block 752 and the first hinge segment 610 when folding of the panel 100 is performed.

Each of the first and second free stop modules 710 and 730 can further include a friction block 755.

The friction block 755 can be inserted into the sliding block 753 and can physically contact the guide groove 751a of the guide block 751. The friction block 755 according to an embodiment can include a friction plate 755a installed in the sliding block 753 and a plurality of friction rails 755b which protrude in parallel from a rear surface of the friction plate 755a. The plurality of friction rails 755b can long extend along the second direction Y and can be arranged in parallel along the first direction X. Each of the plurality of friction rails 755b can include a cross-sectional surface having a curve shape, with respect to the first direction X. The sliding block 753 can include a plate inserting groove 753a, into which the friction plate 755a of the friction block 755 is inserted, and a plurality of rail inserting holes 755b into which the plurality of friction rails are respectively inserted.

When folding of the chain 754 is performed, the friction block 755 can generate a friction force between the plurality of friction rails 755b and the guide block 751 to incrementally control sliding and/or a sliding speed of the sliding block 753, thereby incrementally controlling an unfolded angle of the panel 100.

Figure 9A:
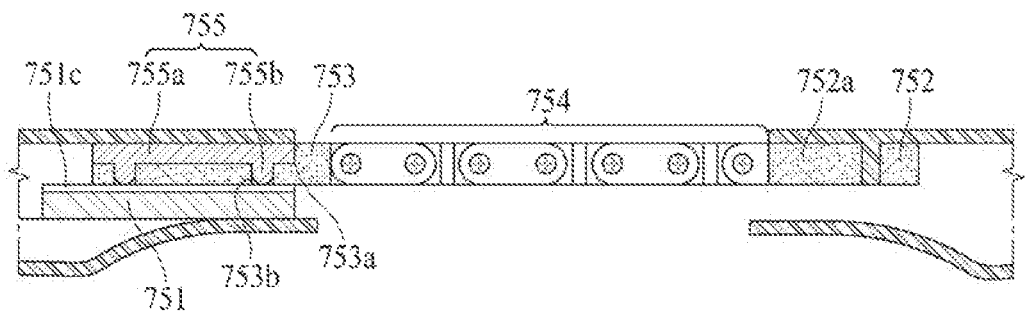
FIGS. 9A and 9B are diagrams for describing an operation of an unfolded angle control module illustrated in FIG. 8.
Figure 9B:
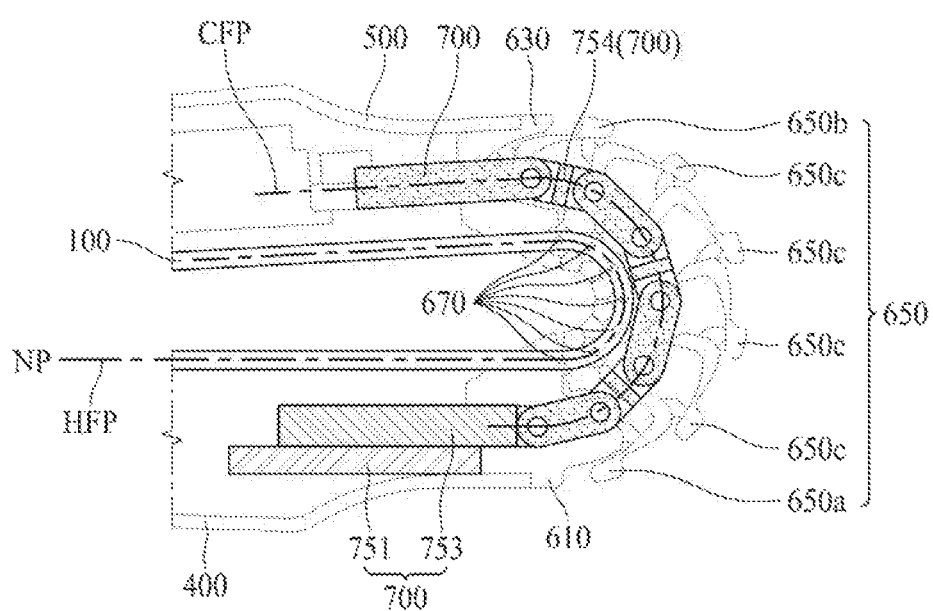

FIGS. 9A and 9B are diagrams for describing an example of an operation of the unfolded angle control module illustrated in FIG. 8.

An operation of the unfolded angle control module according to the present disclosure will be described below with reference to FIGS. 9A and 9B.

First, in a state where the panel 100 is unfolded, each of the first and second free stop modules 710 and 730 of the unfolded angle control module can be unfolded in a planar state, and thus, the sliding block 753 can maintain a state of being supported by the guide block 751.

Subsequently, when the unfolded panel 100 is folded, each of the first and second free stop modules 710 and 730 of the unfolded angle control module can incrementally control an unfolded angle of the panel 100, based on a frictional force which is generated between the sliding block 753 and the guide block 751 when the sliding block 753 slides according to folding of the panel 100. That is, when folding of the panel 100 is performed, a frictional force generated between the sliding block 753 and the guide block 751 can increase as an unfolded angle of the panel 100 increases due to a difference between a hinge folding path HFP of the hinge module and a chain folding path CFP of the chain 754. Also, when it is configured that a friction force is additionally generated between the sliding block 753 and the first hinge segment 610, a frictional force generated between the sliding block 753 and the guide block 751 can more increase. Accordingly, the unfolded angle control module 700 according to an embodiment of the present disclosure can incrementally control an unfolded angle of the panel 100 when folding of the panel 100 is performed. Therefore, a user can set an unfolded angle of the panel 100 to a desired angle.

Figure 10:
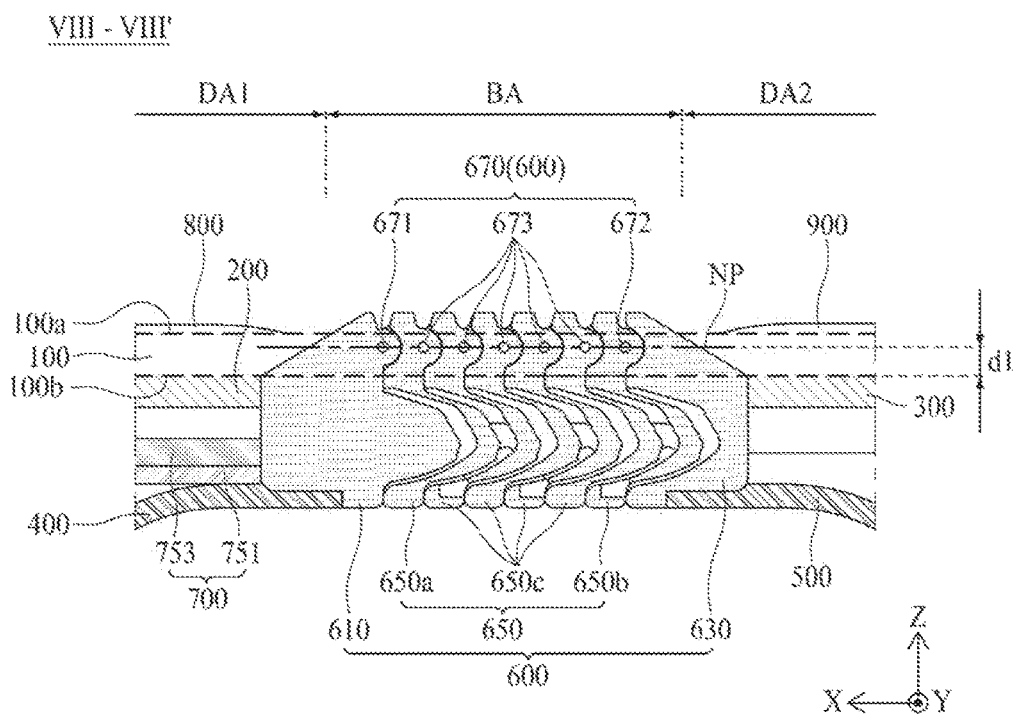
FIG. 10 is a cross-sectional view taken along line VIII-VIII' illustrated in FIG. 1.

FIG. 10 is a cross-sectional view taken along line VIII-VIII' illustrated in FIG. 1 and is a diagram for describing an unfolded state of the foldable display apparatus according to the present disclosure.

Referring to FIG. 10, in the foldable display apparatus according to the present disclosure, each of the plurality of hinge segments 610, 630, and 650 configuring the hinge module 600 can rotate in a horizontal state according to an unfolding operation, and thus, the panel 100 can be unfolded in a flat state (or 180 degrees). At this time, the plurality of hinge segments 610, 630, and 650 can overlap one another, and thus, bodies of the plurality of hinge segments 610, 630, and 650 can surface-contact one another. That is, when the panel 100 is unfolded, a side protrusion provided in each of the first hinge segment 610 and the plurality of intermediate segments 650 can be accommodated into an accommodation groove of a next hinge segment adjacent thereto, and thus, bodies of adjacent hinge segments 610, 630, and 650 can surface-contact one another. Also, the bending area BA of the unfolded panel 100 can be supported by a panel supporting surface provided in each of the plurality of hinge segments 610, 630, and 650, and a rear surface of the bending area BA can be completely concealed by the plurality of hinge segments 610, 630, and 650 overlapping one another and may not externally be exposed.

Moreover, when the panel 100 is unfolded, the unfolded angle control module 700 can incrementally control an unfolded angle of the panel 100, based on a frictional force which is generated between the sliding block 753 and the guide block 751 according to sliding of the chain 754.

Therefore, according to the present disclosure, the panel 100 can be substantially unfolded at 180 degrees but is prevented from being unfolded at more than 180 degrees, and constant flatness of the bending area BA is maintained. Also, according to the present disclosure, the bending area BA is prevented from being bent or pushed by an external force, and thus, touch sensing sensitivity in the bending area BA is enhanced. Furthermore, according to the present disclosure, an unfolded angle of the panel 100 can be set to various angles.

Figure 11:
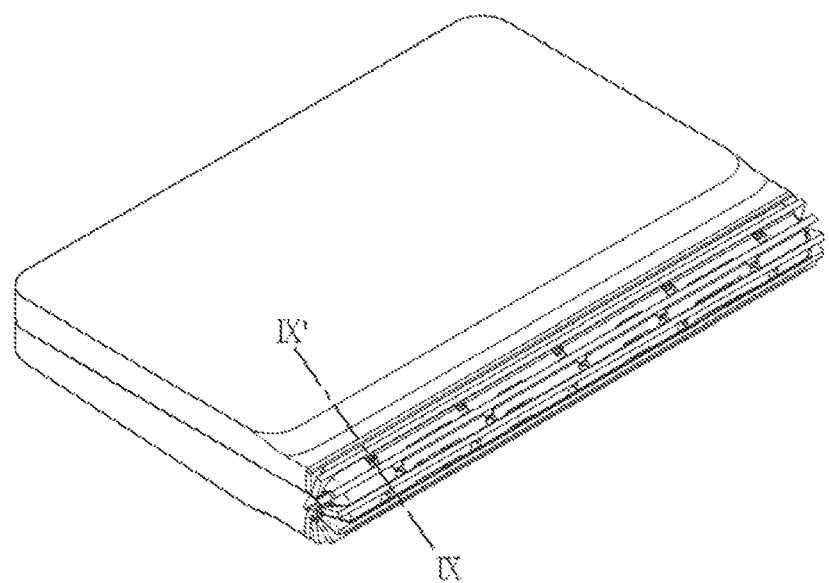
FIG. 11 is a diagram illustrating a folded state of a foldable display apparatus according to an embodiment of the present disclosure.
Figure 12:
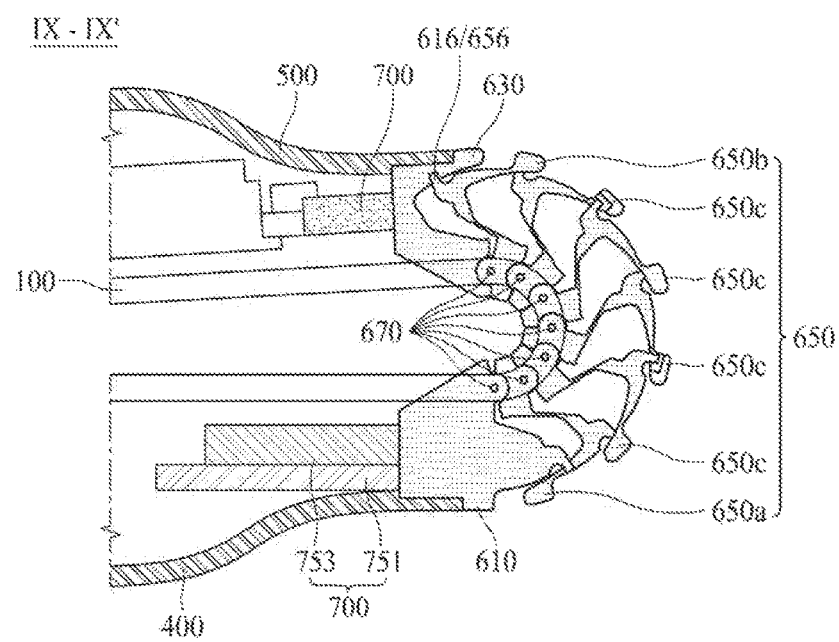
FIG. 12 is a cross-sectional view taken along line IX-IX' illustrated in FIG. 11.

FIG. 11 is a diagram illustrating a folded state of a foldable display apparatus according to an embodiment of the present disclosure, and FIG. 12 is a cross-sectional view taken along line IX-IX' illustrated in FIG. 11. FIGS. 11 and 12 are diagrams for describing an example of a folded state of the foldable display apparatus according to an embodiment of the present disclosure.

Referring to FIGS. 9B, 11 and 12, in the foldable display apparatus according to an embodiment of the present disclosure, each of a plurality of hinge segments 610, 630, and 650 configuring a hinge module can rotate along a hinge folding path HFP according to a folding operation, and thus, the bending area of the panel 100 can be bent to have a ⊃-shaped cross-sectional surface having a certain curvature radius (for example, 2.5 mm), whereby the first display area and the second display area can be disposed to directly face each other. That is, when a folding operation of the foldable display apparatus is performed, the panel 100 can be folded as an inner bending type where the display unit is not externally exposed and is protected by a first housing 400, a second housing 500, and the hinge module.

When the panel 100 is folded, each of the plurality of hinge segments 610, 630, and 650 configuring the hinge module can rotate about a corresponding hinge shaft of a plurality of hinge shafts 670, and an interval between the hinge segments 610, 630, and 650 can increase, whereby the hinge segments 610, 630, and 650 can be folded in a curve shape. In this case, each of the plurality of hinge segments 610, 630, and 650 can extend along the hinge folding path HFP which is set to match the neutral surface NP provided (i.e., provided in the panel 100) between the front surface and the rear surface of the panel 100, and thus, a bending stress applied to the bending area folded in a curve shape is minimized. Accordingly, according to the present disclosure, when the panel 100 is folded, a bending stress applied to the bending area BA of the panel 100 is minimized, and thus, a crack caused by the bending stress does not occur in the bending area BA of the panel 100, thereby enhancing the reliability of the panel 100.

Moreover, when the panel 100 is folded, a rear surface of the bending area is completely concealed by side protrusions of the plurality of extending hinge segments 610, 630, and 650, and thus, is not externally exposed. That is, when the panel 100 is folded, side protrusions of a first hinge segment 610 and a plurality of intermediate segments 650 can be respectively unloaded from the plurality of intermediate segments 650 and a second hinge segment 650 and can extend in a curve shape to completely cover the rear surface of the bending area bent in a curve shape.

Moreover, when the panel 100 is folded, an inclined surface of each of one side and the other side of a skirt provided in each of the plurality of extending hinge segments 610, 630, and 650 can contact adjacent segments. Therefore, in the present disclosure, a curvature radius and a shape of the panel 100 can be set based on a position of each of the plurality of extending hinge segments 610, 630, and 650. Also, a stopper 616 provided in the first hinge segment 610 can move along a guide slit provided a next hinge segment adjacent thereto, and then, can contact a stepped part, whereby the movement of the stopper 616 can be stopped. Also, a stopper 656 provided in each of the plurality of intermediate segments 650 can move along a guide slit provided a next hinge segment adjacent thereto, and then, can contact a stepped part, whereby the movement of the stopper 656 can be stopped. Accordingly, in the present disclosure, a maximum rotation of each of the first hinge segment 610 and the plurality of intermediate segments 650 can be restricted by the contact between the stopper 616 (656) and the stepped part, and in a state where the hinge module 600 is folded, an individual movement of each of the plurality of hinge segments 610, 620, and 650 is prevented.

Moreover, when the panel 100 is folded, the unfolded angle control module 700 can incrementally control a folded angle of the panel 100, based on a frictional force which is generated between the sliding block 753 and the guide block 751 according to sliding of the chain 754. Accordingly, according to the present disclosure, a folded angle of the panel 100 can be set to various angles.

As described above, according to the embodiments of the present disclosure, a crack caused by a bending stress does not occur in the bending region of the flexible display panel in a folding operation of the flexible display panel, and thus, the reliability of the flexible display panel is enhanced. Also, according to the embodiments of the present disclosure, a folded angle or an unfolded angle of the flexible display panel can be set to an angle desired by a user.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. A foldable display apparatus comprising:
a flexible display panel configured to display an image and including a first display area, a bending area, and a second display area;
a first frame supporting a first rear surface of the flexible display panel overlapping the first display area;
a second frame supporting a second rear surface of the flexible display panel overlapping the second display area;
a first housing accommodating the first frame;
a second housing accommodating the second frame;
a hinge module connected between the first housing and the second housing to support the bending area and to guide a bending of the bending area; and
an unfolded angle control module extending through the hinge module and controlling any one folding angle of the flexible display panel between a full folded state and an unfolded planar state,
wherein the hinge module comprises a hinge folding path disposed between a front surface and a rear surface of the flexible display panel.

2. The foldable display apparatus of claim 1, wherein the flexible display panel comprises a panel folding path disposed between the front surface and the rear surface of the flexible display panel, and
the hinge folding path and the panel folding path are disposed in parallel on a same plane.

3. The foldable display apparatus of claim 2,
wherein one side of the unfolded angle control module is connected to one of the first frame and the first housing, and another side of the unfolded angle control module passes through the hinge module and is connected to one of the second frame and the second housing.

4. The foldable display apparatus of claim 3, wherein the unfolded angle control module comprises a first free stop module and a second free stop module disposed in parallel, and
each of the first free stop module and the second free stop module comprises:
a guide block installed in one of the first frame and the first housing;
a fixing block installed in one of the second frame and the second housing;
a sliding block movably supported by the guide block; and
a chain connected between the fixing block and the sliding block to pass through the hinge module.

5. The foldable display apparatus of claim 4, wherein each of the first free stop module and the second free stop module further comprises a friction block disposed in the sliding block, and
an unfolded angle of the flexible display panel is incrementally controlled based on a frictional force which is generated between the friction block and the guide block according to a folding of the chain.

6. The foldable display apparatus of claim 5, wherein the guide block comprises a concave-convex structure provided on a top of the guide block.

7. The foldable display apparatus of claim 1, wherein the hinge module comprises:
a plurality of hinge segments each including a panel supporting surface supporting the bending area of the flexible display panel; and
a plurality of hinge shafts rotatably supporting two adjacent hinge segments, and
a center of each of the plurality of hinge shafts moves along the hinge folding path.

8. The foldable display apparatus of claim 7, wherein the plurality of hinge segments comprise a first hinge segment connected to the first frame, and
the first hinge segment comprises:
a first body;
a first panel supporting surface provided on a front surface of the first body to support the bending area of the flexible display panel;
a first side protrusion protruding from one sidewall of the first body;
a pair of first skirts respectively protruding in parallel from one side and another side of a front surface of the first body with the first panel supporting surface therebetween; and
a first segment connector provided in the pair of first skirts to support a corresponding hinge shaft.

9. The foldable display apparatus of claim 8, wherein
the plurality of hinge segments comprise a second hinge segment connected to the second frame, and
the second hinge segment comprises:
a second body;
a second side protrusion protruding from one sidewall of the second body, the second side protrusion including a first accommodation groove which is concavely provided;
a second panel supporting surface provided on a front surface of the second body to support the bending area of the flexible display panel;
a pair of second skirts respectively protruding in parallel from one side and another side of a front surface of the second body with the second panel supporting surface therebetween; and
a second segment connector provided in the pair of second skirts to support a corresponding hinge shaft.

10. The foldable display apparatus of claim 9, wherein
the plurality of hinge segments comprise a plurality of intermediate segments, and
the plurality of intermediate segments each comprise:
a third body;
a third side protrusion protruding from one sidewall of the third body, the third side protrusion including a second accommodation groove which is concavely provided;
a third panel supporting surface provided on a front surface of the third body to support the bending area of the flexible display panel;
a pair of third skirts respectively protruding in parallel from one side and another side of a front surface of the third body with the third panel supporting surface therebetween; and
a third segment connector provided on each of one side and another side of the pair of third skirts to support a corresponding hinge shaft.

11. The foldable display apparatus of claim 10, wherein
when the flexible display panel is in the unfolded planar state, each of the first and third side protrusions is accommodated into an accommodation groove of a next hinge segment adjacent thereto, and
when the flexible display panel is folded, each of the first and third side protrusions is unloaded from the accommodation groove of the next hinge segment and covers a rear surface of the bending area which is bent in a curve shape.

12. The foldable display apparatus of claim 11, wherein
each of the first hinge segment and the plurality of intermediate segments further comprises a plurality of stoppers provided in a corresponding side protrusion,
each of the second hinge segment and the plurality of intermediate segments further comprises a plurality of guide slits, provided in the corresponding side protrusion, and a stepped part provided in a corresponding body to communicate with each of the plurality of guide slits, and
the plurality of stoppers are respectively inserted into the plurality of guide slits provided in next hinge segments adjacent thereto.

13. The foldable display apparatus of claim 12, wherein the plurality of guide slits are spaced apart from the plurality of stoppers, respectively.

14. The foldable display apparatus of claim 12, wherein when the flexible display panel is folded, a movement of each of the plurality of stoppers is restricted by a stepped part provided in each of the next hinge segments.

15. The foldable display apparatus of claim 10, wherein
the first segment connector of the first hinge segment comprises a first connector, protruding from the one side of the pair of first skirts and including a first shaft inserting hole, and a first rotation guide groove provided concavely from the one side of the pair of first skirts adjacent to the first connector,
the second segment connector of the second hinge segment comprises a second connector, protruding from one side of the pair of second skirts and including a second shaft inserting hole, and a second rotation guide groove provided concavely from the one side of the pair of second skirts adjacent to the second connector, and
the third segment connector of the plurality of intermediate segments comprises a third connector protruding from the one side of the pair of third skirts and including a third shaft inserting hole, a third rotation guide groove provided concavely from the one side of the pair of third skirts adjacent to the third connector, a fourth connector protruding from the other side of the pair of third skirts and including a fourth shaft inserting hole, and a fourth rotation guide groove provided concavely from the other side of the pair of third skirts adjacent to the fourth connector.

16. The foldable display apparatus of claim 15, wherein
shaft inserting holes of two adjacent segments overlap each other,
a first hinge shaft of the plurality of hinge shafts is commonly inserted into the first shaft inserting hole and a fourth shaft inserting hole of a first intermediate segment, which is adjacent to the first hinge segment, of the plurality of intermediate segments,
a second hinge shaft of the plurality of hinge shafts is commonly inserted into the second shaft inserting hole and a third shaft inserting hole of a second intermediate segment, which is adjacent to the second hinge segment, of the plurality of intermediate segments, and
each of intermediate hinge shafts of the plurality of hinge shafts, except for the first and second hinge shafts, is commonly inserted into the third shaft inserting hole and the fourth shaft inserting hole of adjacent intermediate segments.

17. A foldable display apparatus comprising:
a flexible display panel configured to display an image and including a first display area, a bending area, and a second display area;
a first frame supporting a first rear surface of the flexible display panel overlapping the first display area;
a second frame supporting a second rear surface of the flexible display panel overlapping the second display area;
a first housing accommodating the first frame;
a second housing accommodating the second frame;
a hinge module including a panel supporting surface supporting a third rear surface of the flexible display panel overlapping the bending area, the hinge module being bent along a hinge folding path spaced apart from the panel supporting surface to bend the bending area; and
an unfolded angle control module controlling any one folding angle of the flexible display panel between a full folded state and an unfolded planar state,
wherein the flexible display panel comprises a panel folding path disposed between a front surface and a rear surface of the flexible display panel, and a distance between the panel supporting surface and the hinge folding path is equal to a distance between the panel supporting surface and the panel folding path.

18. The foldable display apparatus of claim 17, wherein one side of the unfolded angle control module is connected to one of the first frame and the first housing, and another side of the unfolded angle control module passes through the hinge module and is connected to one of the second frame and the second housing.

19. The foldable display apparatus of claim 18, wherein the unfolded angle control module comprises a first free stop module and a second free stop module disposed in parallel, and each of the first free stop module and the second free stop module comprises:

a guide block installed in one of the first frame and the first housing;

a fixing block installed in one of the second frame and the second housing;

a sliding block movably supported by the guide block; and a chain connected between the fixing block and the sliding block to pass through the hinge module.

20. The foldable display apparatus of claim 19, wherein each of the first free stop module and the second free stop module further comprises a friction block disposed in the sliding block, and an unfolded angle of the flexible display panel is incrementally controlled based on a frictional force which is generated between the friction block and the guide block according to a folding of the chain.

21. The foldable display apparatus of claim 20, wherein the guide block comprises a concave-convex structure provided on a top of the guide block.

22. The foldable display apparatus of claim 17, wherein the panel folding path is a bending path of a neutral surface provided in the bending area of the flexible display panel.

* * * * *